United States Patent
Jiang

(10) Patent No.: US 11,139,352 B1
(45) Date of Patent: Oct. 5, 2021

(54) ORGANIC LIGHT EMITTING DIODE DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Qian Jiang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 491 days.

(21) Appl. No.: 16/327,090

(22) PCT Filed: Jan. 15, 2019

(86) PCT No.: PCT/CN2019/071685
§ 371 (c)(1),
(2) Date: Feb. 21, 2019

(87) PCT Pub. No.: WO2020/118841
PCT Pub. Date: Jun. 18, 2020

(30) Foreign Application Priority Data

Dec. 10, 2018 (CN) .......................... 201811500908.3

(51) Int. Cl.
*H01L 27/32* (2006.01)
*H01L 51/52* (2006.01)
*H01L 51/50* (2006.01)

(52) U.S. Cl.
CPC ........ *H01L 27/3246* (2013.01); *H01L 27/322* (2013.01); *H01L 51/5056* (2013.01); *H01L 51/5072* (2013.01); *H01L 51/5092* (2013.01); *H01L 51/5237* (2013.01)

(58) Field of Classification Search
CPC H01L 27/3246; H01L 51/5237; H01L 27/322
See application file for complete search history.

(56) References Cited

U.S. PATENT DOCUMENTS

| 2011/0297943 A1 | 12/2011 | Kim et al. |
| 2013/0001603 A1 | 1/2013 | Lim et al. |
| 2015/0137090 A1 | 5/2015 | Lee et al. |

FOREIGN PATENT DOCUMENTS

| CN | 103000823 A | 3/2013 |
| CN | 104659059 A | 5/2015 |
| CN | 104733632 A | 6/2015 |

*Primary Examiner* — Anthony Ho

(57) ABSTRACT

An organic light emitting diode (OLED) display device is provided. The OLED display device comprises a substrate, a buffer layer, an active layer, a first gate insulating layer, a gate metal layer, a second gate insulating layer, a source/drain metal layer, a passivation layer, a planarization layer, an organic photoresist layer, an anode metal layer, a pixel defining layer, an OLED pixel layer, and a thin film encapsulation layer. The organic photoresist layer is disposed on a surface of the planarization layer. The organic photoresist layer is provided as a protruding structure.

16 Claims, 2 Drawing Sheets

ORGANIC LIGHT EMITTING DIODE DISPLAY DEVICE

FIELD OF INVENTION

This disclosure relates to display technology, and more particularly, to an organic light emitting diode display device.

BACKGROUND OF INVENTION

In the conventional display field, organic light emitting diode (OLED) has broad potentiality due to its high efficiency, simple production process, and excellent characteristics. A sub-pixel sized film pattern, a red luminescent material layer pattern, a green material luminescent layer pattern, and a blue material luminescent layer pattern are formed by luminescent material layers of a conventional OLED display device and are deposited in a concave portion of a pixel defining layer. The pixel defining layer of the conventional OLED display device is a trapezoidal structure, so that red light, green light, and blue light emitted by a light emitting film pattern layer on the pixel defining layer are emitted perpendicular to a screen. That causes a brightness viewing angle limitation of the screen and a color shift phenomenon.

In summary, in the conventional OLED display device, since the light emitting pixel array on the screen is planar, the light emitted by the light emitting film pattern layer is perpendicular to the screen, which further causes the screen to have a viewing angle limitation and a screen color shift phenomenon.

SUMMARY OF INVENTION

In the conventional OLED display device, since the light emitting pixel array on the screen is planar, the light emitted by the light emitting film pattern layer is perpendicular to the screen, which further causes the screen to have a viewing angle limitation and a screen color shift phenomenon.

The object of this disclosure is to provide an organic light emitting diode display device, which is capable of emitting light emitted from a light emitting film pattern layer in multiple directions to solve a technical problem that the light emitting pixel array on the screen is planar, the light emitted by the light emitting film pattern layer is perpendicular to the screen. That causes the screen to have a viewing angle limitation and a screen color shift phenomenon.

In order to solve the above-mentioned drawbacks, the disclosure provides a technical solution as follow.

The disclosure provides an organic light emitting diode (OLED) display device comprising a substrate, a buffer layer, an active layer, a first gate insulating layer, a gate metal layer, a second gate insulating layer, a source/drain metal layer, a passivation layer, a planarization layer, an organic photoresist layer, an anode metal layer, a pixel defining layer, an OLED pixel layer, and a thin film encapsulation layer.

A first via hole is formed through the second gate insulating layer. The source/drain metal layer is in communication with the active layer through the first via hole. A second via hole is formed through the passivation layer and the planarization layer to expose the source/drain metal layer. The anode metal layer is in communication with the source/drain metal layer through the second via hole. The organic photoresist layer is disposed on a surface of the planarization layer. The organic photoresist layer is provided as a protruding structure, the protruding structure includes a straight portion and a slope portion, the straight portion is disposed at a top edge of the protruding structure, and the slope portion is disposed at two sides of the protruding structure.

In the OLED display device according to an embodiment of the disclosure, the protruding structure is a single layer film structure.

In the OLED display device according to an embodiment of the disclosure, the protruding structure is a two-layer film structure.

In the OLED display device according to an embodiment of the disclosure, a columnar protrusion is disposed on a surface of the planarization layer, and the columnar protrusion covers two edges of two adjacent organic photoresist layers.

In the OLED display device according to an embodiment of the disclosure, material of the columnar protrusion is the same as material of the pixel defining layer, and a height of the columnar protrusion is greater than a height of the pixel defining layer.

In the OLED display device according to an embodiment of the disclosure, a height of the columnar protrusion has a range from 1 um to 10 um.

In the OLED display device according to an embodiment of the disclosure, the OLED pixel layer comprises a hole injection layer, a hole transport layer, a light emitting layer, a hole blocking layer, an electron transport layer, an electron injection layer, a metal electrode layer, and an organic coating layer or the like, and is not limited to the above layers.

In the OLED display device according to an embodiment of the disclosure, the light emitting layer further comprises a red light emitting layer, a green light emitting layer, and a blue light emitting layer.

In the OLED display device according to an embodiment of the disclosure, the light emitting layer is a white light emitting layer, interval gaps are disposed on the thin film encapsulation layer, and a color filter layer is disposed on each of the interval gaps.

The disclosure further provides an organic light emitting diode (OLED) display device comprising a substrate, a buffer layer, an active layer, a first gate insulating layer, a gate metal layer, a second gate insulating layer, a source/drain metal layer, a passivation layer, a planarization layer, an organic photoresist layer, an anode metal layer, a pixel defining layer, an OLED pixel layer, and a thin film encapsulation layer.

A first via hole is formed through the second gate insulating layer. The source/drain metal layer is in communication with the active layer through the first via hole. A second via hole is formed through the passivation layer and the planarization layer to expose the source/drain metal layer. The anode metal layer is in communication with the source/drain metal layer through the second via hole. The organic photoresist layer is disposed on a surface of the planarization layer. The organic photoresist layer is provided as a protruding structure.

In the OLED display device according to an embodiment of the disclosure, a columnar protrusion is disposed on a surface of the planarization layer, and the columnar protrusion covers two edges of two adjacent organic photoresist layers.

In the OLED display device according to an embodiment of the disclosure, material of the columnar protrusion is the same as material of the pixel defining layer, and a height of the columnar protrusion is greater than a height of the pixel defining layer.

In the OLED display device according to an embodiment of the disclosure, a height of the columnar protrusion has a range from 1 urn to 10 um.

In the OLED display device according to an embodiment of the disclosure, the OLED pixel layer comprises a hole injection layer, a hole transport layer, a light emitting layer, a hole blocking layer, an electron transport layer, an electron injection layer, a metal electrode layer, and an organic coating layer or the like, and is not limited to the above layers.

In the OLED display device according to an embodiment of the disclosure, the light emitting layer further comprises a red light emitting layer, a green light emitting layer, and a blue light emitting layer.

In the OLED display device according to an embodiment of the disclosure, the light emitting layer is a white light emitting layer, interval gaps are disposed on the thin film encapsulation layer, and a color filter layer is disposed on each of the interval gaps.

Advantageous effects of the disclosure are as follows. The disclosure provides an organic light emitting diode (OLED) display device. The organic photoresist layer provided as a protruding structure is disposed on the planarization layer, so that the light emitted by the light emitting film pattern layer on the organic photoresist layer is emitted in a plurality of directions, thereby further increasing the uniformity of the emitted light more uniform and further improving a view angle of the display device.

DESCRIPTION OF DRAWINGS

In order to more clearly illustrate the embodiments of the disclosure or the technical solutions in the prior art, the following briefly introduces the accompanying drawings used in the embodiments. Obviously, the drawings in the following description merely show some of the embodiments of the disclosure. As regards one of ordinary skill in the art, other drawings can be obtained in accordance with these accompanying drawings without making creative efforts.

DETAILED DESCRIPTION OF PREFERRED EMBODIMENTS

Figure 1:
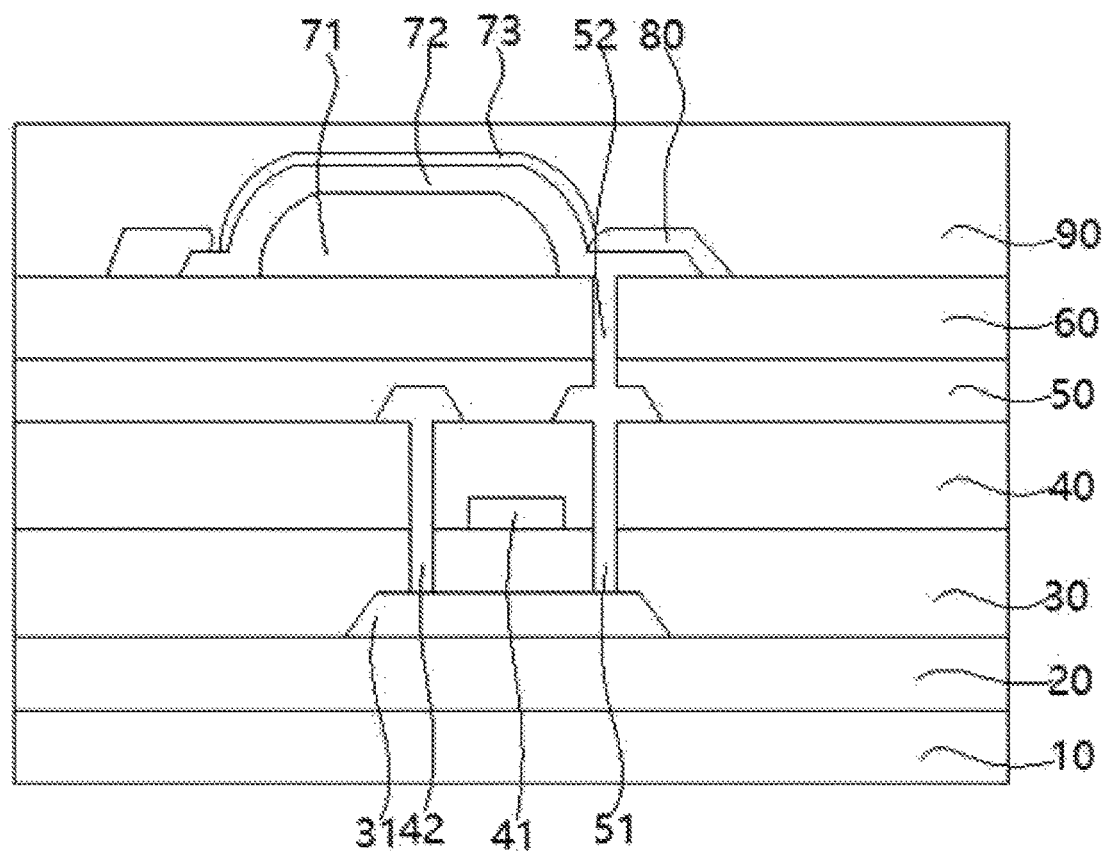
FIG. 1 is a structural schematic diagram of an organic light emitting diode (OLED) display device of the disclosure.

This description of the exemplary embodiments is intended to be read in connection with the accompanying drawings, which are to be considered part of the entire written description. In the description, terms such as "lower", "upper", "horizontal", "vertical", "above", "below", "up", "down", "top", and "bottom", as well as derivatives thereof, should be construed to refer to the orientation as then described or as shown in the drawing under discussion. These terms are for convenience of description and do not require that the apparatus be constructed or operated in a particular orientation, and do not limit the scope of the disclosure. Referring to the drawings of the disclosure, similar components are labeled with the same number.

The disclosure is to provide an organic light emitting diode display device compared to a conventional organic light emitting diode (OLED) display device. Since a light emitting pixel array on a screen is planar, the light emitted by the light emitting film pattern layer is perpendicular to the screen. That causes a technical problem of the screen having a viewing angle limitation. The disclosure provides a technical solution to solve the above-mentioned drawbacks.

Referring to FIG. 1, a structural schematic diagram of an OLED display device of the disclosure is shown. The disclosure provides an OLED display device comprising a substrate 10, a buffer layer 20, an active layer 31, a first gate insulating layer 30, a gate metal layer 41, a second gate insulating layer 40, a source/drain metal layer 51, a passivation layer 50, a planarization layer 60, an organic photoresist layer 71, an anode metal layer 72, a pixel defining layer 80, an OLED pixel layer 73, and a thin film encapsulation layer 90.

A first via hole 42 is formed through the second gate insulating layer 40. The source/drain metal layer 51 is in communication with the active layer 31 through the first via hole 42. A second via hole 52 is formed through the passivation layer 50 and the planarization layer 60 to expose the source/drain metal layer 51. The anode metal layer 72 is in communication with the source/drain metal layer 51 through the second via hole 52. The organic photoresist layer 71 is disposed on a surface of the planarization layer 60. The organic photoresist layer 71 is provided as a protruding structure.

Specifically, material of the substrate 10 is polyimide or glass. Material of the buffer layer 20 is one or two selected from the group consisting of silicon nitride or silicon oxide. Material of the first gate insulating layer 30 is silicon nitride or silicon oxide. Material of the second gate insulating layer 40 is the same as the material of the first gate insulating layer. Material of the source/drain metal layer 51 is titanium or titanium aluminum alloy. Material of the gate metal layer 41 is molybdenum. Material of the active layer 31 is a metal oxide, including indium gallium zinc oxide or indium zinc oxide. Material of the passivation layer 50 is a composite layer structure composed of any combination of two or more of silicon oxide, silicon nitride, and nitrogen silicon compound, preferably is a SiO/SiNx laminated structure. The planarization layer 60 is an organic photoresist layer.

Specifically, the organic photoresist layer 71 is coated with a photoresist solution on a surface of the planarization layer 60 by a spin coating or slit coating method. After the photoresist solution is coated on the surface of the planarization layer, the photoresist solution is subjected to heat at a certain temperature and time. Then, a mask is used to expose the photoresist solution and developed and dried after exposure to form a pattern with the protruding structure.

Specifically, the anode metal layer 72 is disposed on the organic photoresist layer 71, so that a shape of the organic photoresist layer 71 has a relatively great influence on the anode metal layer 72. Since the OLED pixel layer 73 is disposed on a surface of the anode metal layer 72, the shape of the organic photoresist layer 71 further affects a pixel array of the OLED pixel layer 73. The anode metal layer 72 is a three-layered structure made of indium tin oxide film/metal film/indium tin oxide film by a physical vapor deposition (PVD) method.

Specifically, a photoresist layer is coated on the anode metal layer 72. An exposure process, photoresist development, and metal electrode layer etching are preformed again, and then a residual photoresist layer is peeled off to form the OLED pixel layer 73.

Specifically, the OLED pixel layer 73 comprises a hole injection layer, a hole transport layer, a light emitting layer, a hole blocking layer, an electron transport layer, an electron injection layer, a metal electrode layer, and an organic coating layer or the like, and is not limited to the above layers.

Specifically, the pixel defining layer 80 is disposed at both edge portions of the anode metal layer 72 and the OLED pixel layer 73. A height of the pixel defining layer 80 may be greater than or equal to a sum of heights of the organic photoresist layer 71 and the anode metal layer 72. The height of the pixel defining layer 80 may also be less than the sum of the heights of the organic photoresist layer 71 and the anode metal layer 72, depending on the process requirements.

Specifically, the thin film encapsulation layer 90 is a sandwich structure. Two inorganic layers are configured to block water and oxygen, and an organic layer sandwiched between the two inorganic layers is configured to achieve a flat and cushioning effect.

Figure 2:
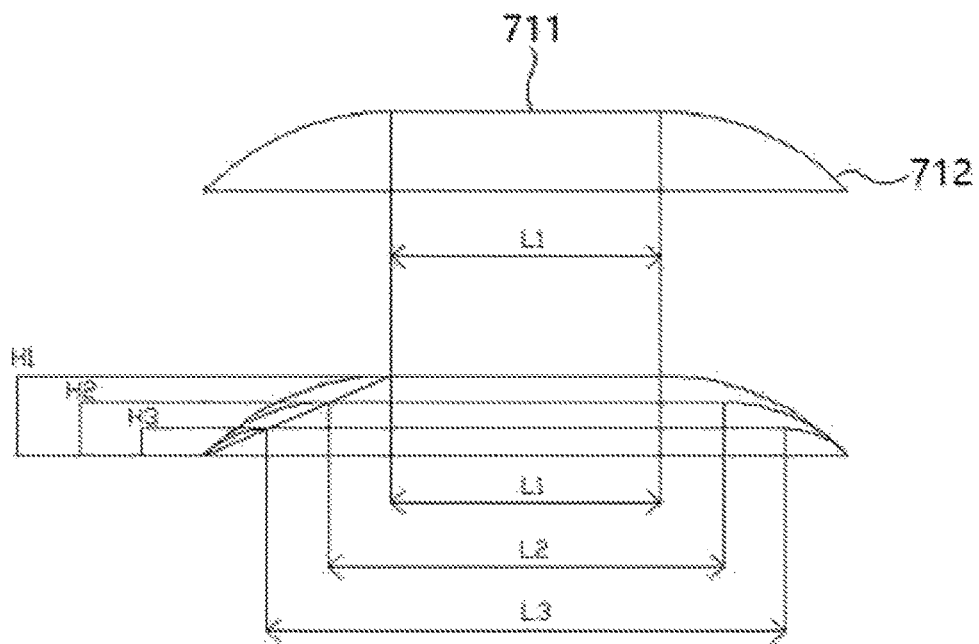
FIG. 2 is a structural schematic diagram of a protruding structure of an organic photoresist layer according to a first embodiment of this disclosure.

As shown in FIG. 2, a structural schematic diagram of a protruding structure of an organic photoresist layer according to a first embodiment of this disclosure is shown. The organic photoresist layer 71 is provided as a protruding structure, the protruding structure includes a straight portion 711 and a slope portion 712. The straight portion 711 is disposed at a top edge of the protruding structure, and the slope portion 712 is disposed at two sides of the protruding structure. The protruding structure is a single layered film structure.

A proportion of a length of the straight portion 711 and the slope portion 712 in a total length has a large influence on optical characteristics of the OLED display device. Specifically, the proportion of the length of the straight portion 711 and the slope portion 712 in the total length has an influence on a proportion of vertical light emitted from the front of the screen and obliquely emitted light. When heights of a first circular arc layer 7121 are H1, H2, and H3, respectively (H1>H2>H3), the lengths of the corresponding straight portions 711 are L1, L2, and L3, respectively (L1<L2<L3). A length of a horizontal portion of the anode metal layer 72 can be adjusted by adjusting a ratio of the length of the straight portion 711 to the total length of the organic photoresist layer 71.

Figure 3:
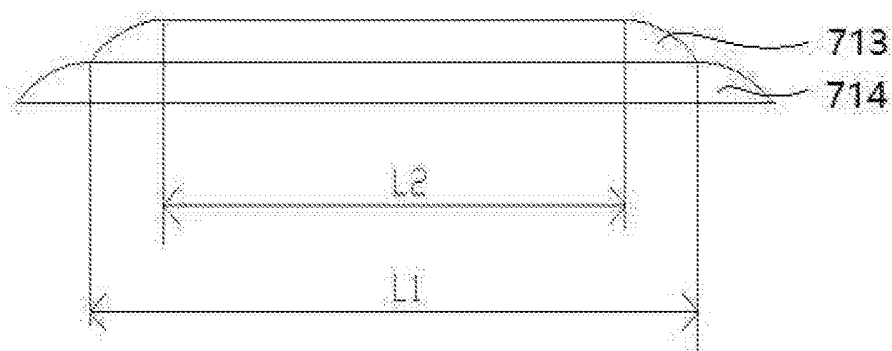
FIG. 3 is a structural schematic diagram of a protruding structure of an organic photoresist layer according to a second embodiment of this disclosure.

Referring to FIG. 3, a structural schematic diagram a protruding structure of an organic photoresist layer according to a second embodiment of this disclosure is shown. The protruding structure is a two-layered film structure. A thickness of the two-layer film films may be the same or different, and a thicknesses of a first layer film 713 and a thicknesses of a second layer film 714 may be determined according to process requirements. Besides, a horizontal portion of the first layer film 713 has a length L1, and a horizontal portion of the second layer film 714 has a length L2. With this structure, a surface of the protruding structure of the two-layered film structure covers the anode metal layer 72, so that the slope portion 712 can be formed with a larger ratio.

Figure 4:
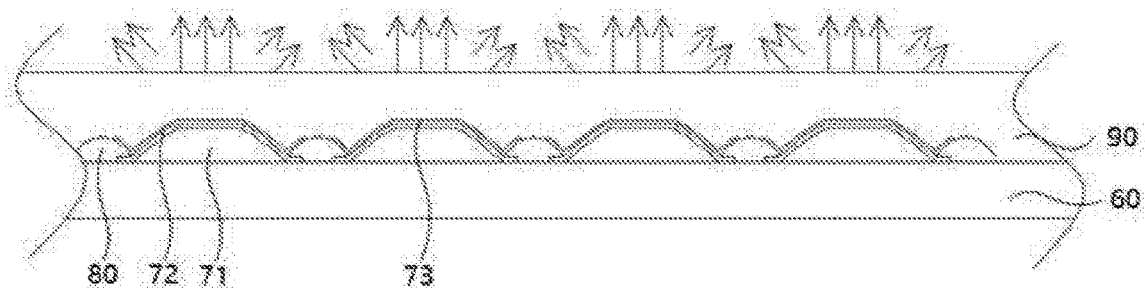
FIG. 4 is a partial enlarged schematic diagram of the OLED display device according to the first embodiment of this disclosure.

Referring to FIG. 4, a partial enlarged schematic diagram of the OLED display device according to the first embodiment of this disclosure is shown. The organic photoresist layer 71 comprising the protruding structure is formed on the planarization layer 60 by using an organic photoresist, and the OLED pixel layer 73 is disposed on a surface of the organic photoresist layer 71. The OLED pixel layer 73 comprises a hole injection layer, a hole transport layer, a light emitting layer, a hole blocking layer, an electron transport layer, an electron injection layer, a metal electrode layer, and an organic coating layer or the like, and is not limited to the above layers. Besides, the hole injection layer, the hole transport layer, the hole blocking layer, the electron transport layer, the electron injection layer, the metal electrode layer, and the organic coating layer or the like are prepared by using a common metal mask, and the light emitting layer is prepared by using a precision metal mask. The light emitting layer comprises a red light emitting layer, a green light emitting layer, and a blue light emitting layer. The red light emitting layer, the green light emitting layer, and the blue light emitting layer are sequentially formed by using a precision metal mask which forms a red luminescent layer, by using a precision metal mask which forms a green luminescent layer, and by using a precision metal mask which forms a blue luminescent layer.

The thin film encapsulation layer 90 covers a lower portion of the OLED pixel layer 73. After an encapsulation process of the thin film encapsulation layer 90 is completed, the red, green, and blue pixels respectively emit red light, green light, and blue light, and the emitted light includes vertical light and oblique light.

Preferably, in order to extend a length of arcs of both sides of the two-layered film structure, the protruding structure formed by a two-layered organic photoresist shown in FIG. 3 can also be used, and the structure of a single-layer or two-layered organic photoresist is determined by the process requirements.

Figure 5:
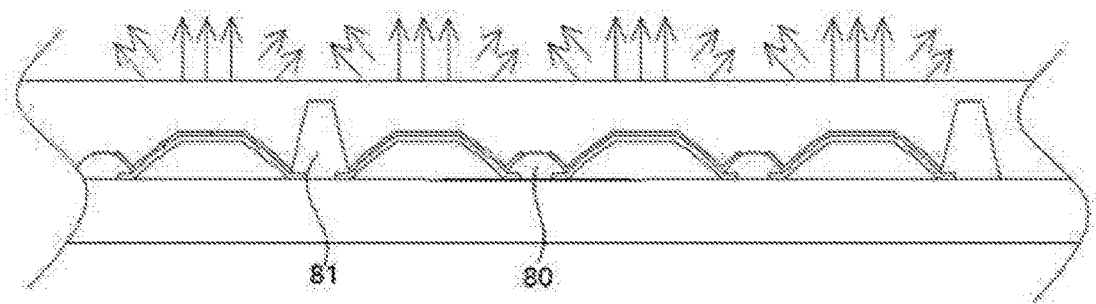
FIG. 5 is a partial enlarged schematic diagram of the OLED display device according to the second embodiment of this disclosure.

Referring to FIG. 5, a partial enlarged schematic diagram of the OLED display device according to the second embodiment of this disclosure is shown. The difference between the first embodiment of the OLED display device of the disclosure and the second embodiment is that a columnar protrusion 81 is disposed on a surface of the planarization layer 60, and the columnar protrusion 81 covers two edges of two adjacent organic photoresist layers 71.

Specifically, material of the columnar protrusion 81 is the same as material of the pixel defining layer 80, and a height of the columnar protrusion 81 is greater than a height of the pixel defining layer 80. The height of the columnar protrusion has a range from 1 um to 10 um, preferably 2 um. The anode metal layer 72 and the OLED pixel defining layer 73 are prepared by a vacuum evaporation method, and the columnar protrusion 81 is configured to control a distance between a metal mask and a thin film transistor (TFT) substrate to ensure that a film deposited on the anode metal layer 72 is not scratched when the metal mask is moved along a horizontal direction. Distribution density of the columnar protrusion 81 is determined according to the process requirements.

Figure 6:
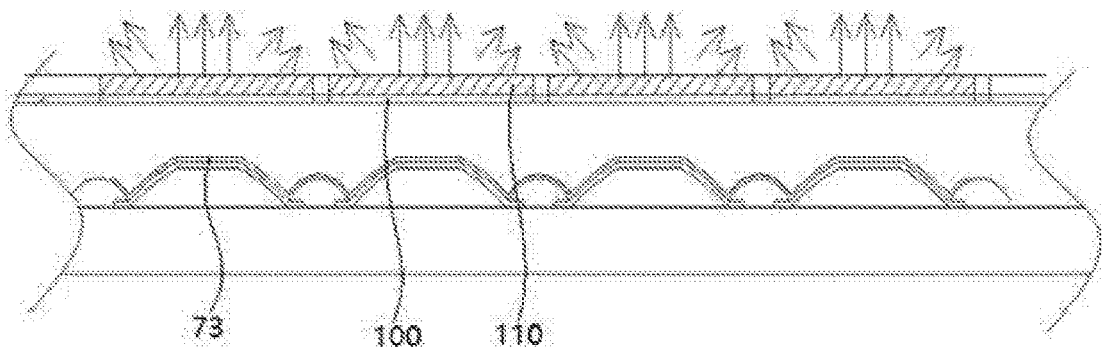
FIG. 6 is a partial enlarged schematic diagram of the OLED display device according to a third embodiment of this disclosure.

Referring to FIG. 6, a partial enlarged schematic diagram of the OLED display device according to a third embodiment of this disclosure is shown. The difference between the first embodiment of the OLED display device of the disclosure and the third embodiment is only that the light emitting layer of the OLED pixel layer 73 is a white light emitting layer. Interval gaps 100 are disposed on the thin film encapsulation layer 90, and a color filter layer 110 is disposed on each of the interval gaps 100.

The OLED pixel layer 73 comprises a hole injection layer, a hole transport layer, a light emitting layer, a hole blocking layer, an electron transport layer, an electron injection layer, a metal electrode layer, and an organic coating layer or the like, and is not limited to the above layers. Each layer of the OLED pixel layers 73 is made of a common mask. The white light emitting layer emits red light, green light, and blue light through the color filter layer 110, respectively, and the emitted light includes vertical light and also includes oblique light.

The OLED display device according to the disclosure can realize that the red light emitting layer, the green light emitting layer, and the blue light emitting layer are disposed on the same horizontal surface, and the three sub-pixels of a red sub-pixel, green sub-pixel, and blue sub-pixel each have a special protruding structure. Light can be emitted vertically upwards form emitting sub-pixels, and a certain proportion of light is obliquely emitted. That can improve the viewing angle characteristics (brightness-viewing characteristics and white color-viewing characteristics) of an OLED display panel.

The OLED display device according to the disclosure further can realize that the red light emitting layer, the green light emitting layer, and the blue light emitting layer are disposed on the same horizontal surface. The OLED pixel layer is a continuous film layer over the entire screen, and emits white light. Each of protruding structures emits white light, and the white light passes through the color filter layer disposed thereon to emit red, green, and blue light.

The OLED display device prepared by the disclosure adds a mask in an array substrate process in comparison with the conventional technology, and the cost is increased. However, the mask during the vapor deposition process is not replaced, and the cost during the vapor deposition process is not increased. The sub-pixels that emit light in the OLED display device of the disclosure are changed from a planar type to a three-dimensional type. The red, green, and blue sub-pixels belong to three-dimensional type emit light including both vertical and oblique light. In the conventional technology, red, green and blue sub-pixels can only emit vertical light. The disclosure can achieve effects that the emitted light is more uniform in all directions. According to this disclosure, the brightness-viewing characteristics of the display screen can be improved. As the viewing angle changes, the screen brightness changes less, and white color shift-viewing angle characteristics can also be improved. The color shift of the display screen is reduced as the viewing angle changes.

Advantageous effects of the disclosure are as follows. The disclosure provides an OLED display device. The organic photoresist layer provided as the protruding structure is disposed on the planarization layer, so that the light emitted by the light emitting film pattern layer on the organic photoresist layer is emitted in a plurality of directions, thereby further increasing the uniformity of the emitted light and further improving a viewing angle of the display device.

This disclosure has been described with preferred embodiments thereof, and it is understood that many changes and modifications to the described embodiment can be carried out without departing from the scope and the spirit of the invention that is intended to be limited only by the appended claims.

What is claimed is:

1. An organic light emitting diode (OLED) display device, comprising:

a substrate;
a buffer layer disposed on a surface of the substrate;
an active layer disposed on a surface of the buffer layer;
a first gate insulating layer disposed on the surface of the buffer layer and covering the active layer;
a gate metal layer disposed on a surface of the first gate insulating layer;
a second gate insulating layer disposed on the surface of the first gate insulating layer and covering the gate metal layer, wherein a first via hole is formed through the second gate insulating layer;
a source/drain metal layer disposed on a surface of the second gate insulating layer, wherein the source/drain metal layer is in communication with the active layer through the first via hole;
a passivation layer disposed on the surface of the second gate insulating layer and covering the source/drain metal layer;
a planarization layer disposed on a surface of the passivation layer, wherein a second via hole is formed through the passivation layer and the planarization layer to expose the source/drain metal layer;
an organic photoresist layer disposed on a surface of the planarization layer;
an anode metal layer disposed on the surface of the planarization layer and completely covering the organic photoresist layer, wherein the anode metal layer is in communication with the source/drain metal layer through the second via hole;
a pixel defining layer disposed on the surface of the planarization layer and covering both edge portions of the anode metal layer;
an OLED pixel layer disposed on a surface of the anode metal layer;
a thin film encapsulation layer disposed on the surface of the substrate and covering the organic photoresist layer, the anode metal layer, the pixel defining layer, and the OLED pixel layer;
wherein the organic photoresist layer is provided as a protruding structure, the protruding structure includes a straight portion and a slope portion, the straight portion is disposed at a top edge of the protruding structure, and the slope portion is disposed at two sides of the protruding structure.

2. The OLED display panel according to claim 1, wherein the protruding structure is a single layered film structure.

3. The OLED display panel according to claim 1, wherein the protruding structure is a two-layered film structure.

4. The OLED display panel according to claim 1, wherein a columnar protrusion is disposed on the surface of the planarization layer, and the columnar protrusion covers two edges of two adjacent organic photoresist layers.

5. The OLED display panel according to claim 4, wherein material of the columnar protrusion is the same as material of the pixel defining layer, and a height of the columnar protrusion is greater than a height of the pixel defining layer.

6. The OLED display panel according to claim 5, wherein a height of the columnar protrusion has a range from 1 um to 10 um.

7. The OLED display panel according to claim 1, wherein the OLED pixel layer comprises a hole injection layer, a hole transport layer, a light emitting layer, a hole blocking layer, an electron transport layer, an electron injection layer, a metal electrode layer, and an organic coating layer or the like, and is not limited to the above layers.

8. The OLED display panel according to claim 7, wherein the light emitting layer further comprises a red light emitting layer, a green light emitting layer, and a blue light emitting layer.

9. The OLED display panel according to claim 7, wherein the light emitting layer is a white light emitting layer, interval gaps are disposed on the thin film encapsulation layer, and a color filter layer is disposed on each of the interval gaps.

10. An OLED display device, comprising:
a substrate;
a buffer layer disposed on a surface of the substrate;
an active layer disposed on a surface of the buffer layer;
a first gate insulating layer disposed on the surface of the buffer layer and covering the active layer;
a gate metal layer disposed on a surface of the first gate insulating layer;
a second gate insulating layer disposed on a surface of the first gate insulating layer and covering the gate metal layer, wherein a first via hole is formed through the second gate insulating layer;
a source/drain metal layer disposed on a surface of the second gate insulating layer, wherein the source/drain metal layer is in communication with the active layer through the first via hole;
a passivation layer disposed on the surface of the second gate insulating layer and covering the source/drain metal layer;
a planarization layer disposed on a surface of the passivation layer, wherein a second via hole is formed through the passivation layer and the planarization layer to expose the source/drain metal layer;
an organic photoresist layer disposed on a surface of the planarization layer;
an anode metal layer disposed on the surface of the planarization layer and completely covering the organic photoresist layer, wherein the anode metal layer is in communication with the source/drain metal layer through the second via hole;
a pixel defining layer disposed on the surface of the planarization layer and covering both edge portions of the anode metal layer;
an OLED pixel layer disposed on a surface of the anode metal layer;
a thin film encapsulation layer disposed on the surface of the substrate and covers the organic photoresist layer, the anode metal layer, the pixel defining layer, and the OLED pixel layer;
wherein the organic photoresist layer is provided as a protruding structure.

11. The OLED display panel according to claim 10, wherein a columnar protrusion is disposed on the surface of the planarization layer, and the columnar protrusion covers two edges of two adjacent organic photoresist layers.

12. The OLED display panel according to claim 11, wherein material of the columnar protrusion is the same as material of the pixel defining layer, and a height of the columnar protrusion is greater than a height of the pixel defining layer.

13. The OLED display panel according to claim 12, wherein a height of the columnar protrusion has a range from 1 um to 10 um.

14. The OLED display panel according to claim 10, wherein the OLED pixel layer comprises a hole injection layer, a hole transport layer, a light emitting layer, a hole blocking layer, an electron transport layer, an electron injection layer, a metal electrode layer, and an organic coating layer or the like, and is not limited to the above layers.

15. The OLED display panel according to claim 14, wherein the light emitting layer further comprises a red light emitting layer, a green light emitting layer, and a blue light emitting layer.

16. The OLED display panel according to claim 14, wherein the light emitting layer is a white light emitting layer, interval gaps are disposed on the thin film encapsulation layer, and a color filter layer is disposed on each of the interval gaps.

* * * * *